United States Patent [19]

Brabetz et al.

[11] 4,190,386

[45] Feb. 26, 1980

[54] METHOD OF PRODUCING HOLES FREE OF ACCRETIONS IN CIRCUIT BOARDS MADE OF PLASTIC

[75] Inventors: Bernhard Brabetz; Helmut Hackl, both of Munich, Fed. Rep. of Germany

[73] Assignee: Siemens Aktiengesellschaft, Berlin & Munich, Fed. Rep. of Germany

[21] Appl. No.: 942,772

[22] Filed: Sep. 15, 1978

[30] Foreign Application Priority Data

Sep. 19, 1977 [DE] Fed. Rep. of Germany ....... 2742143

[51] Int. Cl.[2] .............................................. B23B 51/02

[52] U.S. Cl. .................................... 408/1 R; 408/230; 408/704; 279/6

[58] Field of Search ........... 408/1 R, 226, 238, 241 R, 408/230, 704, 199; 90/15 A, 15 B; 279/6

[56] References Cited

U.S. PATENT DOCUMENTS

| | | | |
|---|---|---|---|
| 2,396,335 | 3/1946 | Moller | 408/230 |
| 3,739,461 | 6/1973 | Cupler | 408/1 R X |
| 3,947,143 | 3/1976 | Gulla | 408/226 |

*Primary Examiner*—Gil Weidenfeld

*Attorney, Agent, or Firm*—Hill, Van Santen, Steadman, Chiara & Simpson

[57] ABSTRACT

A method is disclosed for producing accretion-free holes with a diameter of less than 1.5 mm in circuit boards made of plastic. A hard metal drill is employed having a cylindrical chucking shank and a fluted twist section. A central axis of the twist section of the drill is moved eccentrically in relation to a central axis of rotation and therefore to a central axis of the drilled hole while drilling such that a widening of the hole occurs which is at least 20/μm but not more than 50/μm.

3 Claims, 3 Drawing Figures

Z

1'

2

1

3'

3

L

5

8

6

7

4

5'

Z
1'
2
1
3'
3
L
5
8
6
7
4
5'

16
14
M
12
11
13

Z
15
11
9
2
1'
1
10
3'

METHOD OF PRODUCING HOLES FREE OF ACCRETIONS IN CIRCUIT BOARDS MADE OF PLASTIC

BACKGROUND OF THE INVENTION

The invention relates to a method of producing accretion-free holes with a diameter of less than 1.5 mm in circuit boards made of plastic, preferably circuit boards consisting of a plurality of layers, by means of a hard metal drill bit exhibiting a cylindrical chucking shank and a fluted twist bit.

With materials which, when drilled, do not produce continuous chips but break down into boring powder, there is a danger of the boring powder or dust being pressed against the wall of the hole by the side cutter on the bit and forming a solid film thereon through friction. These accretions are very hard to remove. When drilling multi-layer circuit boards the accretions in the contact holes lead to poor contacts between the separate internal layers. Therefore it has already been proposed in German OS No. 1,704,296, for example, that the boring dust be removed quickly using a jet of compressed air by means of which the boring dust is supposed to be blown out of the contact holes during drilling or when drilling has been completed. However this approach did not produce the desired success. When drilling such contact holes, which have a maximum diameter of 1.5 mm in circuit boards made of synthetic resin, high cutting speeds are used; consequently one has to employ twist drills made of carbide material, of so-called hard metal, to drill the contact holes. To make it easier for the boring dust to flow away during drilling, use is made of so-called "headed" drills in which the fluted twist sections are set back some 0.6 mm behind the tip. This arrangement is supposed to largely eliminate accretion of the boring dust on the wall of the hole due to friction; however even this arrangement can only reduce accretion but not prevent it.

The tip of the drill is constituted by a transverse cutting edge to which the main cutters are connected on either side of the center line of the drill. These main cutters run up to the cutting edges of the twist drill which the spiral side cutters terminating the fluting are adjacent to. The transverse cutting edge is subjected to the greatest load as it cuts into the material less but exerts a rubbing action on the material to be drilled.

SUMMARY OF THE INVENTION

An object of the invention is to improve the drilling of circuit boards by means of procedural steps with a drill of the type described above.

Starting from the method named at the start, the invention consists in keeping the axis of the twist section of the drill eccentric in relation to the axis of rotation and therefore to the axis of the drilled hole during drilling such that the widening of the hole is at least 20 $\mu$m but not more than 50 $\mu$m.

In implementing the method in accordance with the invention, the center line of the twist section of the drill is guided about its axis of rotation. As a result of this, one of the side cutters terminating the fluting is moved at an acute angle over the wall of the drilled hole while the other side cutter remains some distance away from the wall of the drilled hole. It is advantageous if, in order to drill multi-layer circuit boards made of plastic, one uses a drill in which the axis of the twist section is at least 10 $\mu$m, but not more than 30 $\mu$m, eccentric relative to the axis of the chucking shank of the drill. Such drills can be made with comparative ease. But one can also proceed using a chuck or clamp exhibiting an eccentric aperture to hold the chucking shank of the drill. If this approach is adopted, normal drills can be used to drill circuit boards of the kind previously named.

DESCRIPTION OF THE PREFERRED EMBODIMENTS

Figure 1:
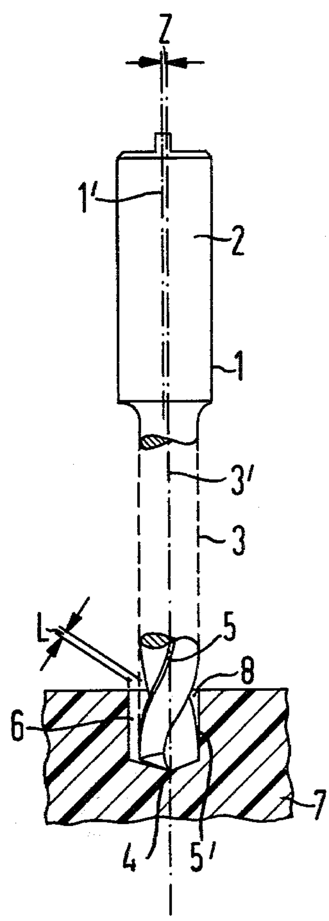
FIG. 1 is a side view illustrating a drilling method of the invention.

In FIG. 1 a hard metal drill 1 for drilling multi-layer circuit boards consists of a cylindrical shank section 2 and a twist section 3 formed on it. For the most part the shank section is of a greater diameter than the nominal diameter of the twist section. As can be seen, here the axis 3' of the twist section is offset by an amount Z in relation to the center line 1' of the shank section. The result of this is that during drilling, the tip 4 of the twist section rotates about the axis 1' of the chucking shank. Only one of the side cutters 5, 5' is in contact with the wall of the hole 6. As a result, accretion of boring dust through friction on the wall of the hole is prevented. The widening L of the hole when drilling a hole 8 in a multi-layer circuit board 7 is approximately 2Z.

Figure 2:
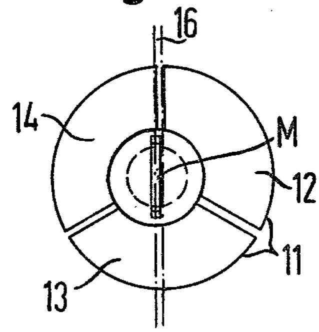
FIG. 2 is a bottom view of an alternate embodiment of the method of the invention.
Figure 3:
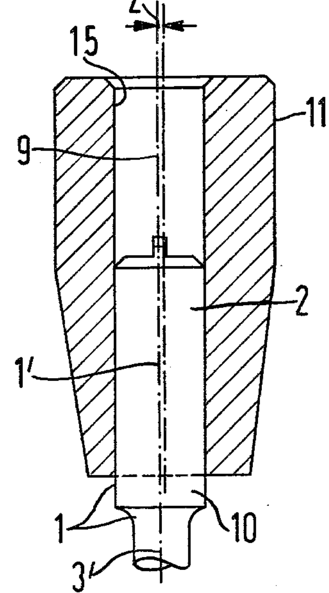
FIG. 3 is a side view of the embodiment of the method shown in FIG. 2.

FIG. 2 shows another possible way of drilling holes in multi-layer circuit boards but here one employs a conventional drill 10 of the kind normally used to drill circuit boards. So with this kind of drill the axis 3' of the twist section coincides with the center line 1' of the shank section 2. To make the drill tip 4 (FIG. 1) rotate about the axis of rotation 9 of the drill, the latter is held in a chuck 11 consisting for instance of three jaws 12, 13 and 14, the opening 15 of which holds the chucking shank 2 of the drill 1 and is offset by an amount Z eccentrically in relation to the center M of the chucking device. The exterior of the drill chuck 11 rotates concentrically with the center M during drilling but in contrast, only the opening 15 describes a circular movement about the center line and axis of rotation 16. In all other respects the drill tip works in just the same way as that in FIG. 1.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method of producing accretion-free holes with a diameter of less than 1.5 mm in circuit boards made of plastic, comprising the steps of: providing a hard metal drill having a cylindrical chucking shank connected to a fluted twist cutting section having a central axis, rotating said fluted twist cutting section about an axis and feeding said fluted twist cutting section along said axis relative to a circuit board, supporting the fluted twist cutting section so that its central axis rotates eccentric to said feed axis of the fluted twist cutting section by a distance sufficient to drill a hole having a diameter of at least 20 micro-meters but not more than 50 micro-meters wider than the maximum diameter of the fluted twist cutting section.

2. A method as in claim 1 comprising the additional step of supporting the fluted twist cutting section on said chucking shank so that said central axis of the fluted twist cutting section is offset from the axis of said shank by at least 10 micro-meters but not more than 25 micro-meters.

3. A method as in claim 1 comprising the additional step of supporting the drill in a tool holder having a bore eccentric to the axis of said tool holder so that said central axis of the fluted twist cutting section is offset from said axis of the tool holder by at least 10 micro-meters but not more than 25 micro-meters.

* * * * *